(12) United States Patent
Liao et al.

(10) Patent No.: US 9,431,406 B1
(45) Date of Patent: Aug. 30, 2016

(54) SEMICONDUCTOR DEVICE AND METHOD OF FORMING THE SAME

(71) Applicant: MACRONIX International Co., Ltd., Hsinchu (TW)

(72) Inventors: Ting-Feng Liao, Hsinchu (TW); Yao-Fu Chan, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/724,573

(22) Filed: May 28, 2015

(51) Int. Cl.
| | |
|---|---|
| H01L 27/115 | (2006.01) |
| H01L 21/265 | (2006.01) |
| H01L 21/266 | (2006.01) |
| H01L 21/02 | (2006.01) |
| H01L 29/66 | (2006.01) |
| H01L 21/308 | (2006.01) |
| H01L 21/28 | (2006.01) |

(52) U.S. Cl.
CPC ..... *H01L 27/11521* (2013.01); *H01L 21/0214* (2013.01); *H01L 21/0217* (2013.01); *H01L 21/02164* (2013.01); *H01L 21/266* (2013.01); *H01L 21/26586* (2013.01); *H01L 21/28273* (2013.01); *H01L 21/3081* (2013.01); *H01L 29/6656* (2013.01); *H01L 29/66825* (2013.01)

(58) Field of Classification Search
CPC . H01L 27/115; H01L 21/266; H01L 21/265; H01L 21/28; H01L 21/02; H01L 29/66; H01L 21/308; H01L 21/26586; H01L 21/28273; H01L 29/788; H01L 29/66825; H01L 29/7883; H01L 29/42328; H01L 27/11521
See application file for complete search history.

(56) References Cited

U.S. PATENT DOCUMENTS

| | | | |
|---|---|---|---|
| 2009/0039410 A1* | 2/2009 | Liu | H01L 21/28273 257/320 |
| 2011/0177661 A1 | 7/2011 | Song et al. | |

FOREIGN PATENT DOCUMENTS

TW   200929376   7/2009

OTHER PUBLICATIONS

"Office Action of Taiwan Counterpart Application", issued on Jun. 27, 2016, p. 1-p. 4, in which the listed references were cited.

* cited by examiner

*Primary Examiner* — Selim Ahmed
(74) *Attorney, Agent, or Firm* — J.C. Patents

(57) ABSTRACT

A semiconductor device and a method of forming the same are provided. At least two separated stacked structures and at least two hard mask patterns respectively on the stacked structures are formed on a substrate. A patterned mask layer is formed on the substrate. The patterned mask layer has an opening which exposes a portion of top surfaces of the hard mask patterns and a portion of the substrate between the stacked structures. The exposed portion of the substrate is removed by using the patterned mask layer and the hard mask patterns as a mask, so as to form a trench in the substrate. An ion implantation process is performed by using the patterned mask layer and the hard mask patterns as a mask, so as to form a doped region in the substrate around the trench.

10 Claims, 3 Drawing Sheets

SEMICONDUCTOR DEVICE AND METHOD OF FORMING THE SAME

BACKGROUND OF THE INVENTION

1. Field of Invention

The present invention relates to an integrated circuit and a method of forming the same, and more generally to a semiconductor device and a method of forming the same.

2. Description of Related Art

A memory is a semiconductor device designed for storing information or data. Among various types of memory products, a non-volatile memory allows multiple-time data programming, reading and erasing operations, and the data stored therein can be retained even after the power to the memory is terminated. With these advantages, the non-volatile memory has become one of the most widely adopted memories for personal computers and electronic equipment.

In a conventional method of forming a non-volatile memory, after gate structures are formed, a single patterned photoresist layer is used as a mask for defining a source line in the substrate between the gate structures. However, the gate structures are easily damaged during the source line defining step includes a dry etching, an ion implantation etc., so the profile of the gate structures and therefore the reliability of the device are deteriorated.

SUMMARY OF THE INVENTION

Accordingly, the present invention provides a semiconductor device and a method of forming the same, in which the semiconductor device can be formed with improved charge storage reliability.

The present invention provides a method of forming a semiconductor device. At least two separated stacked structures and at least two hard mask patterns respectively on the stacked structures are formed on a substrate. A patterned mask layer is formed on the substrate. The patterned mask layer has an opening which exposes a portion of top surfaces of the hard mask patterns and a portion of the substrate between the stacked structures. The exposed portion of the substrate is removed by using the patterned mask layer and the hard mask patterns as a mask, so as to form a trench in the substrate. An ion implantation process is performed by using the patterned mask layer and the hard mask patterns as a mask, so as to form a doped region in the substrate around the trench.

According to an embodiment of the present invention, an included angle between an ion implantation direction of the ion implantation process and a normal to the substrate is about 23 degrees to 27 degrees.

According to an embodiment of the present invention, the hard mask patterns include silicon oxide, silicon nitride, silicon oxynitride or a combination thereof.

According to an embodiment of the present invention, the step of forming the trench in the substrate includes performing an anisotropic etching process.

According to an embodiment of the present invention, the patterned mask layer includes a photoresist material.

According to an embodiment of the present invention, each stacked structure includes a first conductive layer, an interlayer dielectric layer and a second conductive layer sequentially located on the substrate.

According to an embodiment of the present invention, each of the first conductive layer and the second conductive layer includes doped polycrystalline silicon, undoped polycrystalline silicon or a combination thereof.

According to an embodiment of the present invention, the method further includes removing the patterned mask layer and the hard mask patterns, and forming a plurality of spacers respectively on the stacked structures.

According to an embodiment of the present invention, the spacers include silicon oxide, silicon nitride, silicon oxynitride or a combination thereof.

The present invention further provides a semiconductor device including a substrate, a plurality of stacked structures and a doped region. The stacked structures are located on the substrate, wherein the substrate has therein a trench between adjacent stacked structures, and each stacked structure includes a floating gate, an inter-gate dielectric layer and a control gate sequentially located on the substrate. The doped region is located in the substrate around the trench, wherein a volume ratio of a first portion to a second portion of the control gate is less than about 12%, an electrical conductivity of the first portion is lower than an electrical conductivity of the second portion, and the first portion is closer to a top corner of the trench than the second portion.

According to an embodiment of the present invention, the first portion includes amorphous silicon, the second portion includes polycrystalline silicon.

According to an embodiment of the present invention, a volume ratio of a third portion to a fourth portion of the floating gate is less than about 8%, an electrical conductivity of the third portion is lower than an electrical conductivity of the fourth portion, and the third portion is closer to a sidewall of the trench than the fourth portion.

According to an embodiment of the present invention, the third portion includes amorphous silicon; the fourth portion includes polycrystalline silicon.

According to an embodiment of the present invention, a difference between a top width and a bottom width of each stacked structure is less than about 0.03 µm.

According to an embodiment of the present invention, the semiconductor device further includes a plurality of spacers respectively located on the stacked structures.

The present invention also provides a semiconductor device including a substrate, a plurality of stacked structures and a doped region. The stacked structures are located on the substrate, wherein the substrate has therein a trench between adjacent stacked structures, and each stacked structure includes a floating gate, an inter-gate dielectric layer and a control gate sequentially located on the substrate. The doped region is located in the substrate around the trench, wherein an interface between polycrystalline silicon and amorphous silicon of the control gate and a bottom of the control gate define therebetween an acute angle of about 82 degrees to 88 degrees.

According to an embodiment of the present invention, an interface between polycrystalline silicon and amorphous silicon of the floating gate and a bottom of the floating gate define therebetween an acute angle of about 84 degrees to 89 degrees.

According to an embodiment of the present invention, a difference between a top width and a bottom width of each stacked structure is less than about 0.03 µm.

According to an embodiment of the present invention, the semiconductor device further includes a plurality of spacers respectively located on the stacked structures.

In view of the above, in the present invention, a dual mask constituted by a patterned photoresist layer and hard mask patterns (rather than the conventional single photoresist mask) serves as an etching mask to protect the stacked structures, so the etching damage to the stacked structures can be reduced. In addition, the same dual mask serves as an implantation mask to protect the control gate, the inter-gate dielectric layer and the floating gate of each stacked structure, so the ion bombardment damage to the stacked structures can be decreased, and thus, the transformed amount from polycrystalline silicon into amorphous silicon of each of the control gate and the floating gate is reduced upon the ion bombardment. Therefore, the semiconductor device of the present invention can be formed with improved charge storage reliability.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
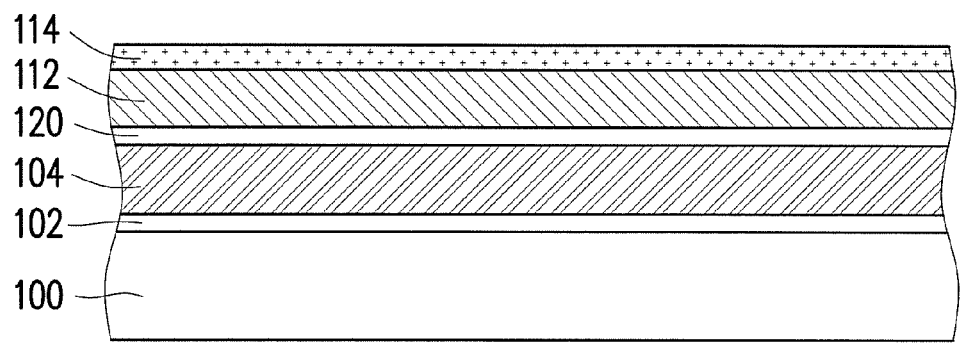
FIG. 1A to FIG. 1E are schematic cross-sectional views of a method of forming a semiconductor device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1E are schematic cross-sectional views of a method of forming a semiconductor device according to an embodiment of the present invention.

Referring to FIG. 1A, a substrate 100 is provided. The substrate 100 can be a semiconductor substrate, such as a silicon substrate or a SiGe substrate. The substrate 100 has a tunnelling dielectric layer 102 formed thereon. The tunnelling dielectric layer 102 includes silicon oxide, silicon oxynitride or a dielectric material with a dielectric constant greater than 4. The method of forming the tunnelling dielectric layer 102 includes performing a chemical vapour deposition (CVD) process, an in-situ steam generation (ISSG) process, a low pressure radical oxidation (LPRO) process, a furnace oxidation process or the like. The tunnelling dielectric layer 102 has a thickness of about 100 angstroms to 110 angstroms.

Thereafter, a plurality of conductive layers 104 is formed on the tunnelling dielectric layer 102. Each conductive layer 104 extends along a first direction. The method of forming the conductive layers 104 includes forming a conductive material layer on the tunnelling dielectric layer 102. The conductive material layer includes doped polycrystalline silicon, undoped polycrystalline silicon or a combination thereof, and the forming method thereof includes performing a CVD process. The conductive material layer has a thickness of about 1,000 angstroms to 1,500 angstroms. The conductive material layer is then patterned with photolithography and etching processes. In an embodiment, the tunnelling dielectric layer 102 is substantially not etched during the step of forming the conductive layers 104, as shown in FIG. 1A, but the invention is not limited thereto. In another embodiment, the tunnelling dielectric layer 102 can be simultaneously patterned during the step of forming the conductive layers 104.

Afterwards, a dielectric material layer 120, a conductive material layer 112 and a hard mask layer 114 are sequentially formed on the substrate 100 covering the tunnelling dielectric layer 102 and the conductive layers 104. In this embodiment, the dielectric material layer 120 can be an oxide/nitride/oxide (ONO) composite layer includes three or more layers, but the invention is not limited thereto. The method of forming the dielectric material layer 120 includes performing a CVD process, a thermal oxidation process or the like. The dielectric material layer 120 has a thickness of about 220 angstroms to 250 angstroms. The conductive material layer 112 includes doped polycrystalline silicon, undoped polycrystalline silicon or a combination thereof, and the forming method thereof includes performing a CVD process. The conductive material layer 112 has a thickness of about 2,200 angstroms to 2,400 angstroms. The hard mask layer 114 includes silicon oxide, silicon nitride, silicon oxynitride or a combination thereof. In this embodiment, the hard mask layer 114 can be, for example but not limited thereto, a single material layer. In another embodiment, the hard mask layer 114 can be a composite layer including different materials. The method of forming the hard mask layer 114 includes performing a CVD process. The hard mask layer 114 has a thickness of about 400 angstroms to 600 angstroms.

Figure 1B:
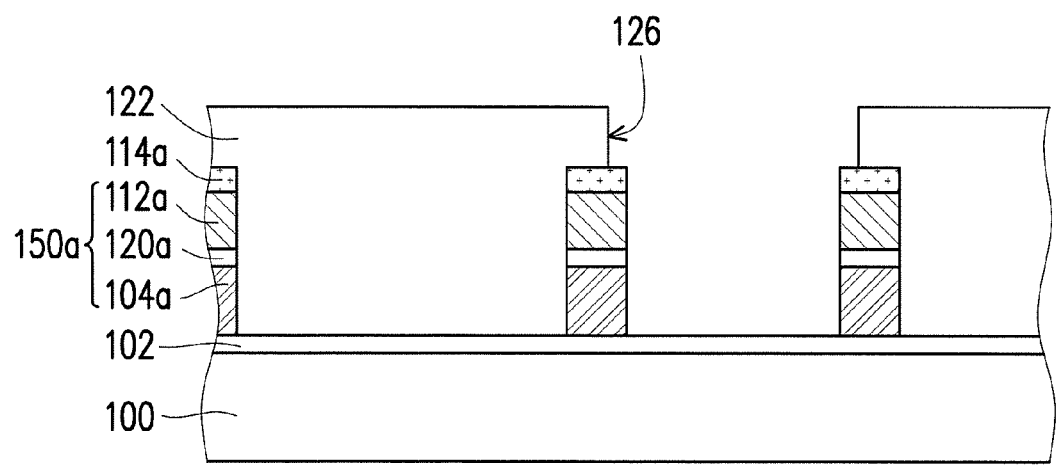

Referring to FIG. 1B, the hard mask layer 114, the conductive material layer 112 and the dielectric material layer 120 and the conductive layers 104 are patterned with photolithography and etching processes, so as to form at least two separate stacked structures 150a and at least two hard mask patterns 114a respectively on the stacked structures 150a on the substrate 100. Each stacked structure 150a includes, from bottom to top, a conductive layer 104a, an interlayer dielectric layer 120a and a conductive layer 112a. The hard mask patterns 114a, the conductive layers 112a and the interlayer dielectric layers 120a all extend along a second direction different from (e.g. perpendicular to) the first direction. The conductive layers 104a are formed as separate islands, and multiple islands are located below one conductive layer 112a. In this embodiment, each conductive layer 104a serves as a floating gate, each interlayer dielectric layer 120a serves as an inter-gate dielectric layer and each conductive layer 112a serves as a control gate.

Afterwards, a patterned mask layer 122 is formed on the substrate 100. The patterned mask layer 122 has an opening 126 that exposes a portion of the tunnelling dielectric layer 102 between the stacked structures 150a. In this embodiment, the opening 126 can further expose a portion of top surfaces of the hard mask layers 114a on the stacked structures 150a. The method of forming the patterned mask layer 122 includes forming a photoresist layer on the substrate 100 and then patterning the photoresist layer with a photolithography process. In an embodiment, the area exposed by the opening 126 is the predetermined area for defining a source line, but the invention is not limited thereto. In another embodiment, the area exposed by the opening 126 can also be the predetermined area for defining a buried conductive line such as a buried bit line.

Figure 1C:
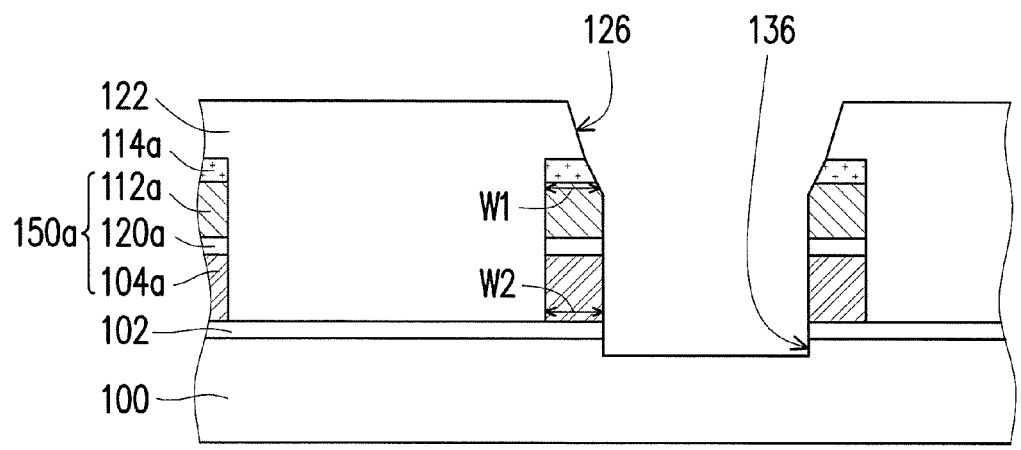

Referring to FIG. 1C, an etching process is performed by using the patterned mask layer 122 and the hard mask patterns 114a as an etching mask, so as to remove the exposed portion of the tunnelling dielectric layer 102 and a portion of the underlying substrate 100, and therefore thin, a trench 136 in the substrate 100. The etching process can be an anisotropic etching process, such as a plasma etching. The plasma etching is performed by using $CF_4$ or $NF_3$ as etching gas, for example. In this embodiment, the said etching process can simultaneously remove a portion of the patterned mask layer 122 and a portion of the hard mask patterns 114a.

Besides, in this embodiment, a dual etching mask constituted by the patterned mask layer 122 and the hard mask patterns 114a is used to replace the conventional single patterned photoresist layer, and the dual etching mask can protect the stacked structures 150a from being seriously damaged during the anisotropic etching process. Specifically, the etching damage to the top corners of the stacked structures 150a approximate to the opening 126 can be significantly reduced. Therefore, upon the anisotropic etching process, the stacked structures 150a still have substantially vertical sidewalls. In an embodiment, the difference between the top width W1 and the bottom width W2 of each stacked structure 150a is less than about 0.03 μm.

Figure 1D:
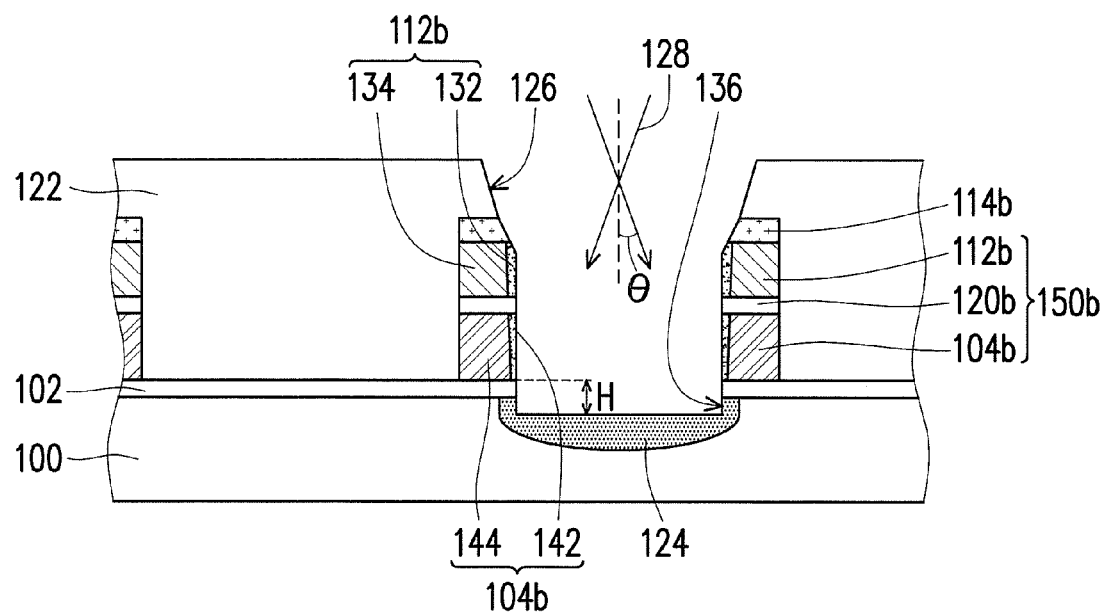

Referring to FIG. 1D, an ion implantation process 128 is performed by using the patterned mask layer 122 and the hard mask patterns 114a as an implantation mask, so as to form a doped region 124 in the substrate 100 around the trench 136. In this embodiment, during the ion implantation process 128, the stacked structures 150a and the hard mask patterns 114a beside the trench 136 are subjected to some ion bombardment, and therefore transform into the stacked structures 150b and the hard mask patterns 114b. The conductive layer 104a, the interlayer dielectric layer 120a and the conductive layer 112a of each stacked structure 150a are respectively transformed into the conductive layer 104b, the interlayer dielectric layer 120b and the conductive layer 112b of each stacked structure 150b upon the ion bombardment. The included angle θ between an ion implantation direction of the ion implantation process 128 and a normal to the substrate 100 is about 23 degrees to 27 degrees.

It is noted that, in this embodiment, in order to reduce the ion bombardment damage to the stacked structures 150a, the trench 136 is formed with a shallower depth, so the doped region 124 around the trench 136 can be formed with a single ion implantation process rather than the conventional multiple ion implantation processes. In an embodiment, the doped region 124 is formed by a single ion implantation process and a subsequent thermal diffusion, so the implanted dopant is diffused to surround the trench 136. In this embodiment, the trench 136 has a depth H of about 300 angstroms to 350 angstroms.

Besides, in this embodiment, the patterned mask layer 122 and the hard mask patterns 114a are simultaneously used as an implantation mask, so the patterned mask layer 122 and the hard mask patterns 114a can protect the stacked structures 150a and therefore reduce the ion bombardment damage to the stacked structures 150a during the ion implantation process 128. In addition, polycrystalline silicon of the conductive layers 104a (as a floating gate) and the conductive layer 120a (as a control gate) in each stacked structure 150a may be partially transformed into amorphous silicon upon the ion bombardment and therefore reduce the charge storage reliability. The stacked structures 150a still have substantially vertical sidewalls upon the etching process in FIG. 1C, and such vertical sidewall profile is beneficial to reduce the ion bombardment damage to the stacked structures 150a and therefore decrease the transformed amount from polycrystalline silicon into amorphous silicon of each of the conductive layers 104a and 120a.

Figure 1E:
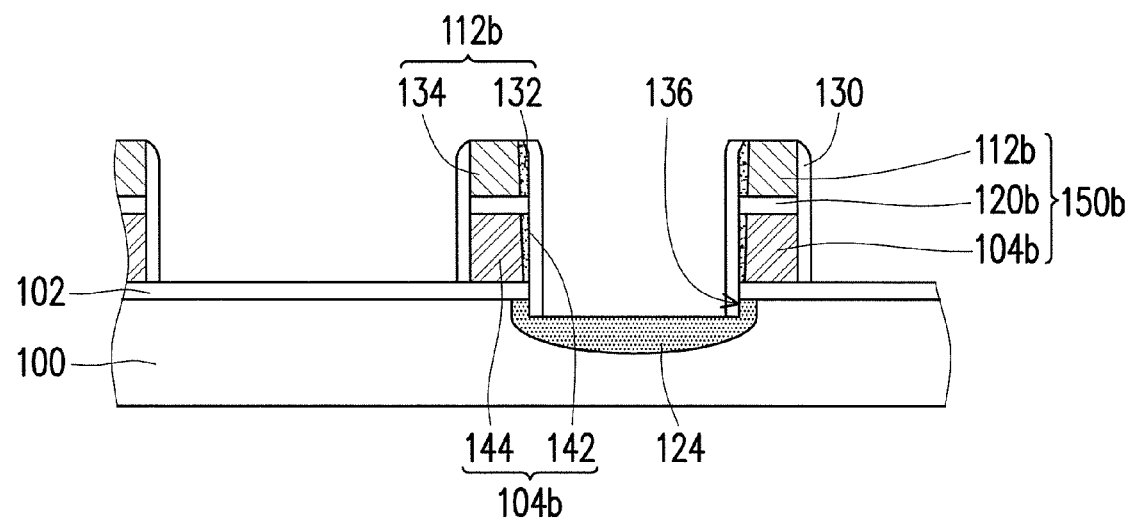

Referring to FIG. 1E, the patterned mask layer 122 is removed. The step of removing the patterned mask layer 122 includes performing a wet stripping method, a dry stripping method or a combination thereof. Thereafter, the hard mask patterns 114a are removed. The step of removing the hard mask patterns 114a includes performing an anisotropic etching process. Afterwards, spacers 130 are respectively formed on the sidewalls of the stacked structures 150b (or the trench 136). The spacers 130 includes silicon oxide, silicon nitride, silicon oxynitride or a combination thereof. The method of forming the spacers 130 includes forming a CVD process and followed by an anisotropic etching process. A self-aligned silicide (salicide) process can be performed after the formation of the spacers 130. The semiconductor device of the present invention is thus completed.

The semiconductor device of the present invention can be described with reference to FIG. 1E in the following. As shown in FIG. 1E, the semiconductor device includes a substrate 100, a plurality of stacked structures 150b, a doped region 124 and a plurality of spacers 130. The stacked structures 150b are located on the substrate 100, wherein the substrate 100 has therein a trench 136 between adjacent stacked structures 150b, and each stacked structure 150b includes a conductive layer 104b (as a floating gate), an interlayer dielectric layer 120b (as an inter-gate dielectric layer) and a conductive layer 112b (as a control gate) sequentially located on the substrate 100. The spacers 130 are respectively located on the sidewalls of the stacked structures 150b.

In an embodiment, the volume ratio of a first portion 132 to a second portion 134 of the conductive layer 112b (as a control gate) is less than about 12%. The electrical conductivity of the first portion 132 is lower than the electrical conductivity of the second portion 134, and the first portion 132 is closer to the top corner and sidewall of the trench 136 than the second portion 134. The first portion 132 can be amorphous silicon, and the second portion 134 can be polycrystalline silicon. The volume ratio of a third portion 142 to a fourth portion 144 of the conductive layer 104b (as a floating gate) is less than about 8%. The electrical conductivity of the third portion 142 is lower than the electrical conductivity of fourth portion 144, and the third portion 142 is closer to the sidewall of the trench 136 than the fourth portion 144. The third portion 142 can be amorphous silicon, and the fourth portion 144 can be polycrystalline silicon.

Figure 2:
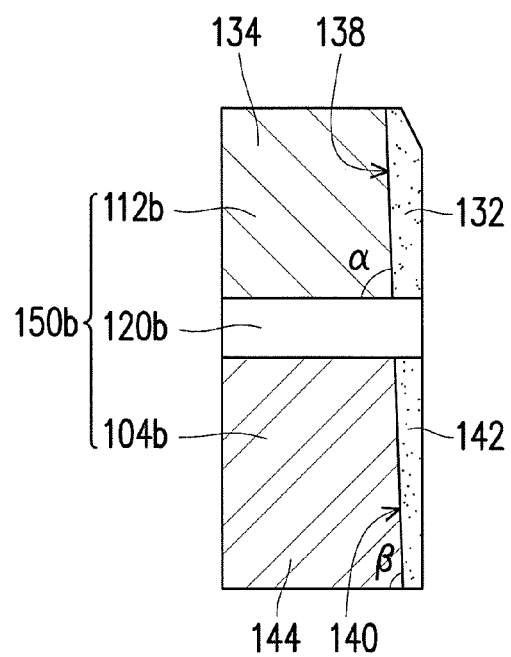
FIG. 2 is an enlarged local view of a stacked structure in FIG. 1E.

FIG. 2 is an enlarged local view of a stacked structure in FIG. 1E. As shown in FIG. 2, in an embodiment, the interface 138 between polycrystalline silicon and amorphous silicon of the conductive layer 112b (as a control gate) and the bottom of the conductive layer 112b define therebetween an acute angle α of about 82 degrees to 88 degrees. In addition, the interface 140 between polycrystalline silicon and amorphous silicon of the conductive layer 104a (as a floating gate) and the bottom of the conductive layer 104a define therebetween an acute angle β of about 84 degrees to 89 degrees.

In summary, in the present invention, a dual mask constituted by a patterned photoresist layer and hard mask patterns serves as an etching mask during an etching process to define a trench, so the sidewalls of the stacked structures besides the trench are protected and therefore subjected to less etching damage, and thus, the conventional inclined sidewalls of the stacked structures upon the etching process is not observed. In addition, the same dual mask serves as an implantation mask during an ion implantation process to define a doped region around the trench, so the control gate, the inter-gate dielectric layer and the floating gate of each stacked structure are protected and therefore subjected to less ion bombardment. The transformed amount from polycrystalline silicon into amorphous silicon of each of the control gate and the floating gate is reduced upon the ion bombardment, and thus, the charge storage reliability is improved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor device, comprising:
   a substrate;
   a plurality of stacked structures, located on the substrate, wherein the substrate has therein a trench between adjacent stacked structures, and each stacked structure comprises a floating gate, an inter-gate dielectric layer and a control gate sequentially located on the substrate; and
   a doped region, located in the substrate around the trench, wherein a volume ratio of a first portion to a second portion of the control gate is less than about 12%, an electrical conductivity of the first portion is lower than an electrical conductivity of the second portion, and the first portion is closer to a top corner of the trench than the second portion.

2. The semiconductor device of claim 1, wherein the first portion comprises amorphous silicon, the second portion comprises polycrystalline silicon.

3. The semiconductor device of claim 1, wherein a volume ratio of a third portion to a fourth portion of the floating gate is less than about 8%, an electrical conductivity of the third portion is lower than an electrical conductivity of the fourth portion, and the third portion is closer to a sidewall of the trench than the fourth portion.

4. The semiconductor device of claim 3, wherein the third portion comprises amorphous silicon, the fourth portion comprises polycrystalline silicon.

5. The semiconductor device of claim 1, wherein a difference between a top width and a bottom width of each stacked structure is less than about 0.03 μm.

6. The semiconductor device of claim 1, further comprising a plurality of spacers respectively located on the stacked structures.

7. A semiconductor device, comprising:
   a substrate;
   a plurality of stacked structures, located on the substrate, wherein the substrate has a trench therein between adjacent stacked structures, wherein each stacked structure comprises a floating gate, an inter-gate dielectric layer and a control gate sequentially disposed on the substrate; and
   a doped region, located in the substrate around the trench, wherein an interface between polycrystalline silicon and amorphous silicon of the control gate and a bottom of the control gate define therebetween an acute angle of about 82 to 88 degrees.

8. The semiconductor device of claim 7, wherein an interface between polycrystalline silicon and amorphous silicon of the floating gate and a bottom of the floating gate define therebetween an acute angle of about 84 to 89 degrees.

9. The semiconductor device of claim 7, wherein a difference between a top width and a bottom width of each stacked structure is less than about 0.03 μm.

10. The semiconductor device of claim 7, further comprising a plurality of spacers respectively located on sidewalls of the stacked structures.

* * * * *